(12) United States Patent
Yoshida et al.

(10) Patent No.: US 7,501,689 B2
(45) Date of Patent: Mar. 10, 2009

(54) UPPER-LAYER METAL POWER STANDARD CELL

(75) Inventors: Takeshi Yoshida, Kanagawa (JP); Yukihiro Urakawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/060,727

(22) Filed: Feb. 18, 2005

(65) Prior Publication Data

US 2005/0189607 A1 Sep. 1, 2005

(30) Foreign Application Priority Data

Feb. 20, 2004 (JP) ............................ 2004-044609

(51) Int. Cl.
  *H01L 21/822* (2006.01)
(52) U.S. Cl. .............................. 257/502; 257/E27.108; 438/618; 438/637; 438/638
(58) Field of Classification Search ................. 257/502; 438/618, 637–638
See application file for complete search history.

(56) References Cited

U.S. PATENT DOCUMENTS

| | | | |
|---|---|---|---|
| 5,987,086 A * | 11/1999 | Raman et al. .................... 716/1 |
| 6,211,549 B1 * | 4/2001 | Funaki et al. ................. 257/329 |
| 6,291,331 B1 * | 9/2001 | Wang et al. .................. 438/618 |
| 6,383,916 B1 * | 5/2002 | Lin .............................. 438/637 |
| 6,448,631 B2 | 9/2002 | Gandhi et al. |
| 6,620,728 B2 * | 9/2003 | Lin .............................. 438/637 |
| 2002/0048930 A1 * | 4/2002 | Lin .............................. 438/622 |
| 2004/0089951 A1 * | 5/2004 | Lin .............................. 257/773 |
| 2005/0245063 A1 * | 11/2005 | Chinthakindi et al. ......... 438/618 |
| 2006/0068574 A1 * | 3/2006 | Lin et al. ...................... 438/584 |
| 2006/0154469 A1 * | 7/2006 | Hess et al. .................... 438/618 |

FOREIGN PATENT DOCUMENTS

| | | |
|---|---|---|
| JP | 02-280353 | 11/1990 |
| JP | 5-82624 | 4/1993 |
| JP | 06-085062 A | 3/1994 |
| JP | 11-045942 | 2/1999 |
| JP | 2001-189427 | 7/2001 |
| JP | 2002-299453 | 10/2002 |

\* cited by examiner

*Primary Examiner*—Zandra Smith
*Assistant Examiner*—Tsz K Chiu
(74) *Attorney, Agent, or Firm*—Oblon, Spivak, McClelland, Maier & Neustadt, P.C.

(57) ABSTRACT

An upper-layer metal power standard cell comprises: a basic power metal layer which is disposed in an upper layer of a circuit and which supplies a power voltage from an outside of the upper-layer metal power standard cell; a transistor element layer which is formed in a predetermined arrangement on a circuit substrate under the basic power metal layer; and an inner wire layer which supplies the power voltage to the transistor element layer disposed under the basic power metal layer disposed in the upper layer from the basic power metal layer.

19 Claims, 10 Drawing Sheets

UPPER-LAYER METAL POWER STANDARD CELL

CROSS REFERENCE TO RELATED APPLICATIONS

This application claims benefit of priority under 35 USC § 119 to Japanese Patent Application No. 2004-044609 filed on Feb. 20, 2004, the entire contents of which are incorporated by reference.

BACKGROUND OF THE INVENTION

The present invention relates to an upper-layer metal power standard cell, an area compression apparatus, and a circuit optimization apparatus, particularly to an upper-layer metal power standard cell, an area compression apparatus, and a circuit optimization apparatus which are superior in area efficiency.

In general, a standard cell type semiconductor integrated circuit realizes a semiconductor integrated circuit in which cells are combined and which has a desired logical function. Each cell is constituted as a minimum unit in which a basic logical circuit is constituted to usually have a minimum area using a plurality of transistors and resistances.

In this standard cell type semiconductor integrated circuit (hereinafter referred to as a standard cell) 1, as shown in FIG. 11(a), an inner wire layer 4 formed by a metal of the same layer, and a polycrystalline silicon layer 6 have been heretofore disposed in a gap between a basic power VDD (supply) metal layer 2 and a basic power ground (GND) metal layer 3. Small white squares formed in the inner wire layer 4 are contacts 5 for use in electrodes of the transistor. An input (In) terminal 7 and an output (Out) terminal 8 are disposed substantially in middle between the basic power metal layers 2, 3 of the standard cell 1.

In the above-described conventional standard cell 1, usually as shown in FIG. 11(b), diffusion layers 9a, 9b are disposed in a part of the surface of a semiconductor substrate 9, the inner wire layer 4 is connected to the respective diffusion layers 9a, 9b via the contacts 5, and the basic power metal layers 2, 3 are disposed apart from the substrate 9. The conventional standard cell 1 is constituted in this manner. Therefore, when a transistor size is optimized with respect to the circuit synthesized by the standard cell 1, a size of the cell is regulated by an interval between the basic power metal layers 2, 3, and optimization is inhibited. Therefore, there has been a problem that size optimization, that is, resizing (readjustment of size/magnitude) cannot be performed.

Moreover, even in a case where a circuit constituted by the standard cell is compacted, an interval between the basic power metal layers 2, 3 is fixed, there has been a sufficient space allowance, and further the inner wire layer 4 is also disposed between the basic power metal layers 2, 3. Therefore, there has been a problem that the compaction cannot be sufficiently performed.

It is to be noted that even in the conventional standard cell, a transistor element layer can be formed on the substrate 9 in such a manner that the element layer slips under the basic power metal layer. In this case, an interval between the drain-side basic power metal layer and the inner wire layer needs to be secured, and therefore a contact which can be originally driven on a drain side cannot be driven, and there has been a problem that performance deterioration of the standard cell cannot be avoided.

A technique for "constituting a power wire 2a for the standard cell as a second metal layer" has been described in Japanese Patent Application Laid-open (Kokai) No. 2001-189427, a term "upper-layer metal" has been described in Japanese Patent Application Laid-open (Kokai) No. 2002-299453, both are metal wires for an inner power wire, and there is disposed an only lowermost layer metal as a basic power metal layer for supplying a power voltage to the standard cell from the outside in any known example.

As another technical document prior to the present application, there are Japanese Patent Application Laid-open (Kokai) No. 5(1993)-82624 and U.S. Pat. No. 6,448,631B2.

The basic power metal layer is formed in the lowermost layer as described above in the conventional standard cell. Therefore, when the transistor size is optimized with respect to the circuit synthesized by the standard cell, the inner power wire regulated by the interval of the basic power metals forms obstruction, and therefore there has been a problem that optimization, that is, resizing cannot be performed.

Moreover, in the compaction of the circuit constituted by the standard cell, there is not a sufficient space allowance between power metals, further the inner power wire is disposed, and therefore there has been a problem that sufficient compaction cannot be performed.

Therefore, when an upper-layer basic power metal layer is disposed on an underlayer including a transistor element or an inner wire, a length (height) of the cell between the basic power metal layers can be reduced. Restriction of size boundary among a plurality of standard cells can be relaxed, and there has been a demand for a standard cell having satisfactory area efficiency as a whole.

SUMMARY OF THE INVENTION

According to a first basic constitution of the present invention, an upper-layer metal power standard cell comprises: a basic power metal layer which is disposed in an upper layer of a circuit and which supplies a power voltage from an outside of the upper-layer metal power standard cell; a transistor element layer which is formed in a predetermined arrangement on a circuit substrate under the basic power metal layer; and an inner wire layer which supplies the power voltage to the transistor element layer disposed under the basic power metal layer disposed in the upper layer from the basic power metal layer.

Moreover, according to a second basic constitution of the present invention, a method of manufacturing an upper-layer metal power standard cell comprises: synthesizing a circuit to be designed as a standard cell; placing a transistor element and a signal wire layer constituting a circuit on an underlayer of a semiconductor substrate based on the synthesized circuit; preparing a replaceable table with respect to placing information of the underlayer based on height information of the standard cell and information of a transistor length; and placing an upper-layer basic power metal layer in a predetermined position on the underlayer, and simulating operation speed information and cell bonding information in the transistor element and the signal wire layer in an allowable range of the replaceable table.

Furthermore, according to a third basic constitution of the present invention, an area compression apparatus comprises: a placing unit configured to arrange standard cells based on predetermined placing information concerning a circuit synthesized using the standard cells; a changeable information generation unit configured to produce changeable information including changeable allowable values of a height and a transistor length of the standard cell with respect to the placing information of the standard cells, obtained from the placing unit, based on height information of each of the arranged standard cells and the standard cell disposed in the vicinity, and information of transistor lengths described in each of the arranged standard cells and the standard cell disposed in the vicinity; and an area compression unit configured to change the height of the standard cell to thereby compress a circuit area in a range of the allowable amount included in the changeable information.

DESCRIPTION OF THE PREFERRED EMBODIMENTS

Embodiments of an upper-layer metal power standard cell, an area compression apparatus, and a circuit optimization apparatus will be described hereinafter in detail with reference to the accompanying drawings.

First Embodiment

Figure 1:
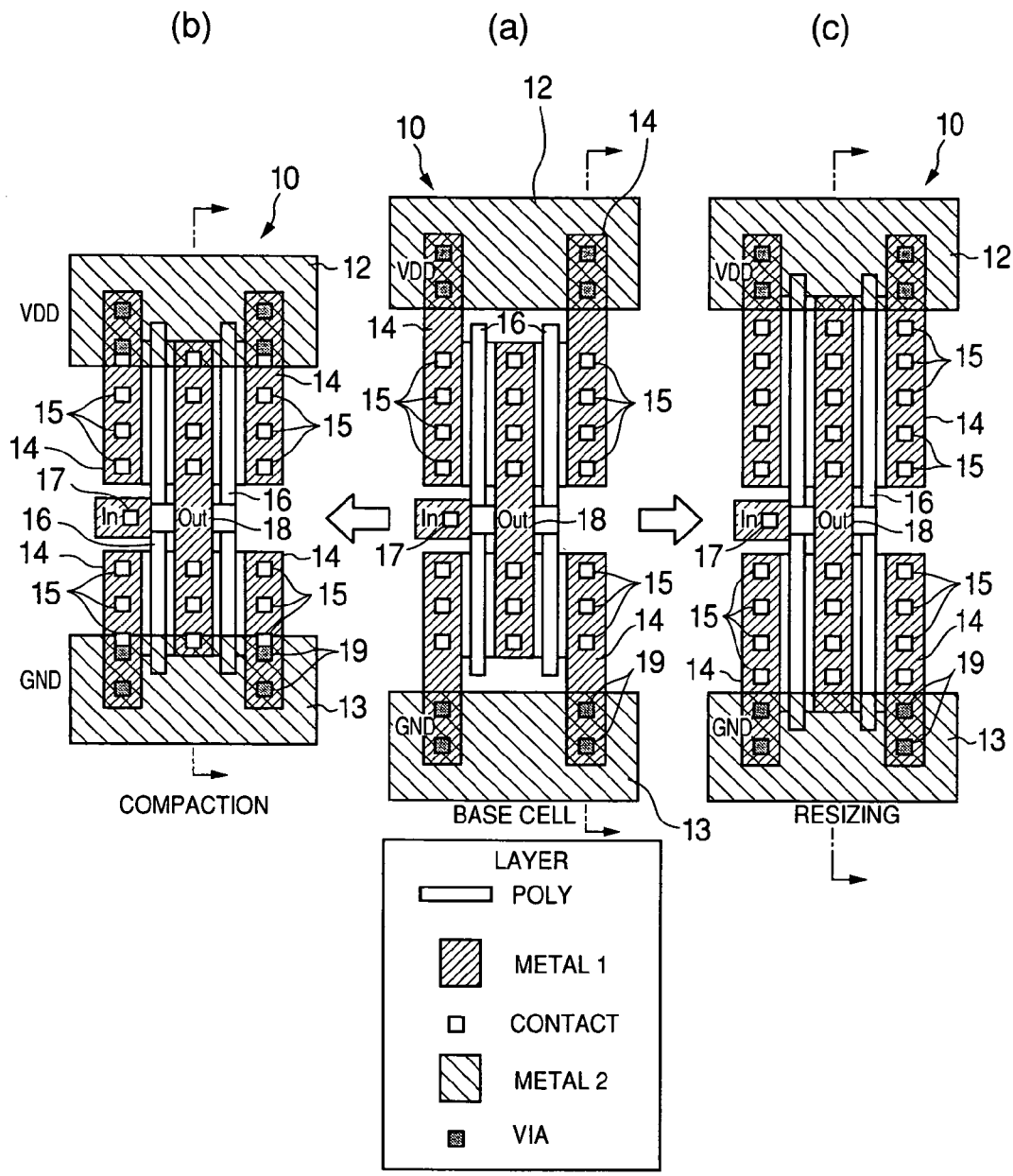
FIG. 1(a) is a plan view showing a basic cell according to a first embodiment.
FIG. 1(b) is a plan view showing compaction.
FIG. 1(c) is a plan view showing a resized upper-layer metal power standard cell.
Figure 11:
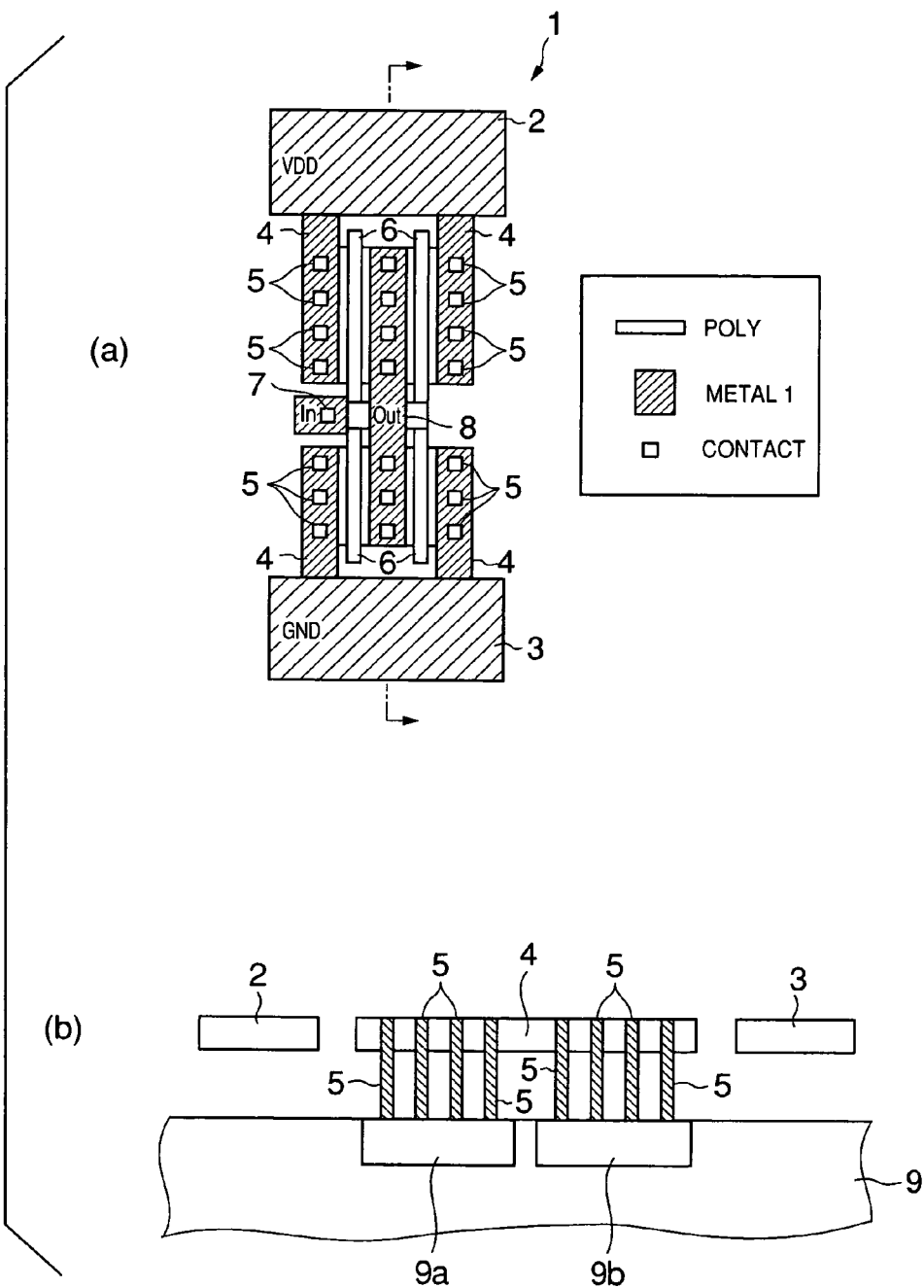
FIG. 11(a) is a plan view showing a conventional standard cell.
FIG. 11(b) is a schematic sectional view.

FIG. 1 shows an upper-layer metal power standard cell 10 according to a first embodiment. Unlike a conventional example shown in FIG. 11, basic power metal layers 12, 13 arranged in one direction (transverse direction in the drawing) are formed only on a second or upper layer in FIG. 1(a) shown in middle. Therefore, in FIG. 1(b) shown on the left side, in which compaction is performed, transistors can slip under the basic power metal layers 12, 13, and therefore a cell area can be reduced. Inner wire layers 14 are formed under the basic power metal layers 12, 13, and polycrystalline silicon layers 16 are also formed under the basic power metal layers 12, 13.

Contact holes 15 are formed in the inner wire layers 14, an input terminal 17 and an output terminal 18 are formed, and connection via holes 19 for electrically connecting the basic power metal layers 12, 13 to the inner wire layer 14 are disposed.

As described above, also in a conventional example shown in FIG. 11(b), when a first layer right on a substrate 9 comprises basic power metal layers 2, 3, the transistors can be formed under the basic power metal layers 2, 3. In this case, since an interval needs to be formed between the basic power metal layer 3 on a drain side and an inner wire layer 4, as many contacts as possible cannot be originally driven on the drain side, and performance of the standard cell is deteriorated.

Moreover, FIG. 1(c) on the right side shows a resizing example in which a size of the transistor is changed. After synthesizing a circuit using standard cells, a transistor size which cannot be compensated for by size variation of the standard cell is optimized. In this case, when the basic power metal layer is formed in a second layer, restriction on the basic power metal layer is moderate as compared with a case where the basic power metal layer is formed in the first layer. Therefore, the size of the transistor can be further increased.

FIGS. 2(a) (b) (c) are schematic sectional views corresponding to cut portions of FIGS. 1(a) (b) (c). The cut portions of FIG. 2(a) only are cut by portions of the inner wire layers 14 including via holes 19. To facilitate understanding of situations of compaction and resizing in FIG. 2(b) (c), a substantially central portion of the standard cell in one direction (transverse direction) is cut, and positional relation of the central inner wire layer 14 with respect to the basic power metal layers 12, 13 is shown. In any sectional view, the standard cell for use in synthesizing the circuit is shown having the basic power metal layers 12, 13, transistor element layer (not shown), and inner wire layer 14. On a circuit substrate 11, a first layer (underlayer) 21 in which the transistor element layer (not shown) subjected to compaction (b) and resizing (c), and a second layer (upper layer) 22 including the basic power metal layers 12, 13 formed in the upper layer are disposed. It is to be noted that in any embodiment, an example in which an underlayer constitutes a first layer, and an upper layer constitutes a second layer is shown. The present invention is not limited to this example, a structure of the underlayer itself is multilayered, for example, including two to five layers, and an uppermost layer may be a basic power metal layer.

All embodiments according to the present invention are characterized in that the second layer 22 including the basic power metal layers 12, 13 disposed in the upper layer of the first layer 21 is disposed. By this constitution, the inner wire layer 14, the polycrystalline silicon layer 16 and the like can be disposed under the second layer 22 which is the upper layer, and it is possible to provide the upper-layer metal power standard cell especially superior in performing the compaction and resizing.

It is to be noted that sectional constitutions of FIGS. 2(a) (b) (c) are simplified in order to avoid complication in the drawings, and details of a circuit constitution or details of electric connection of the inner wire are not shown. A vertical relation of the stacked first layer 21 and second layer 22 with respect to the circuit substrate 11 is only shown. The transistor element layer and inner wire layer formed in the first layer 21 may be disposed for a plurality of standard cells, and the basic power metal layers 12, 13 disposed in the second layer 22 may be disposed for a plurality of standard cells.

Second Embodiment

Figure 2:
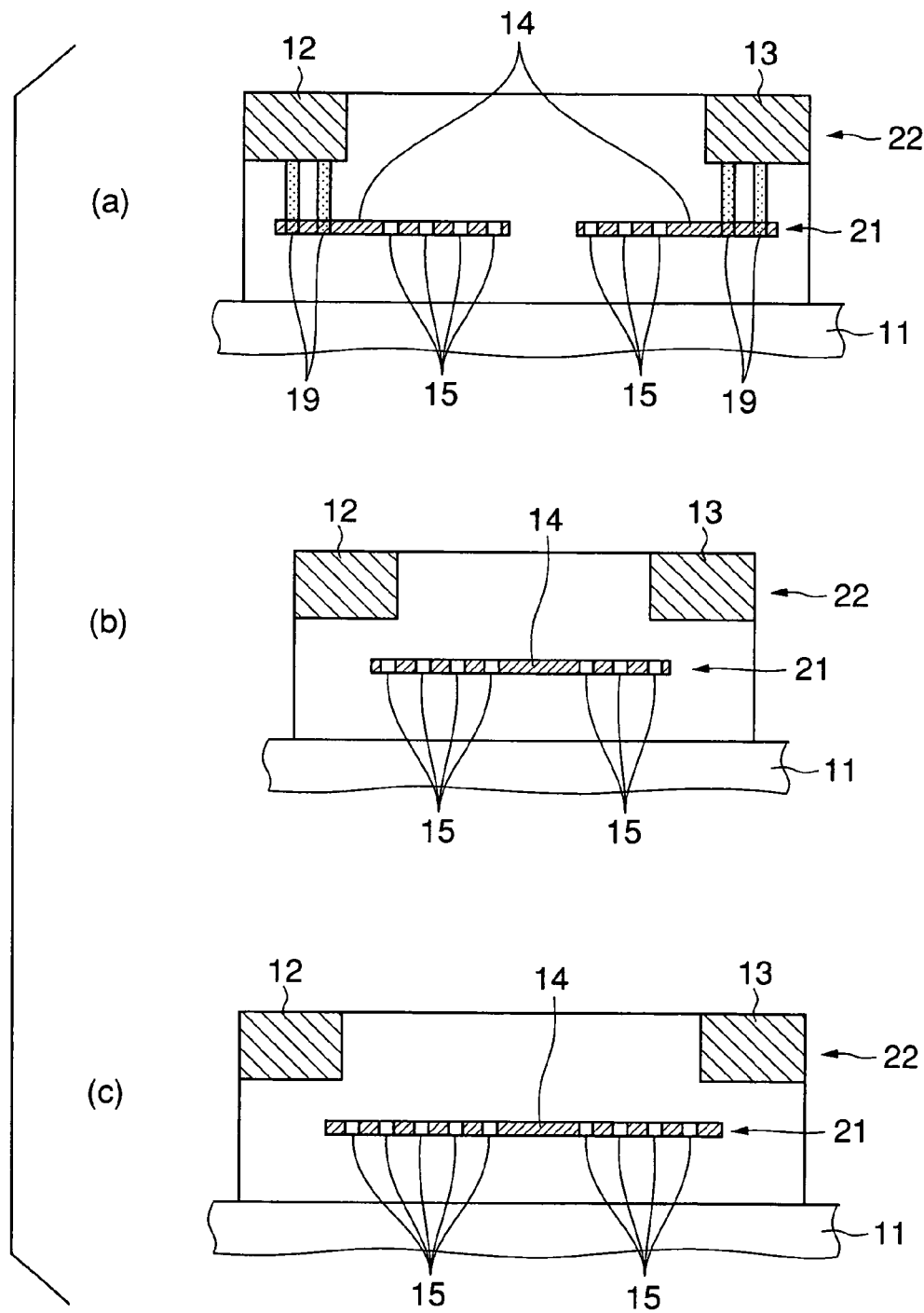
FIG. 2 is a schematic sectional view showing sections corresponding to FIGS. 1(a) (b) (c)
Figure 3:
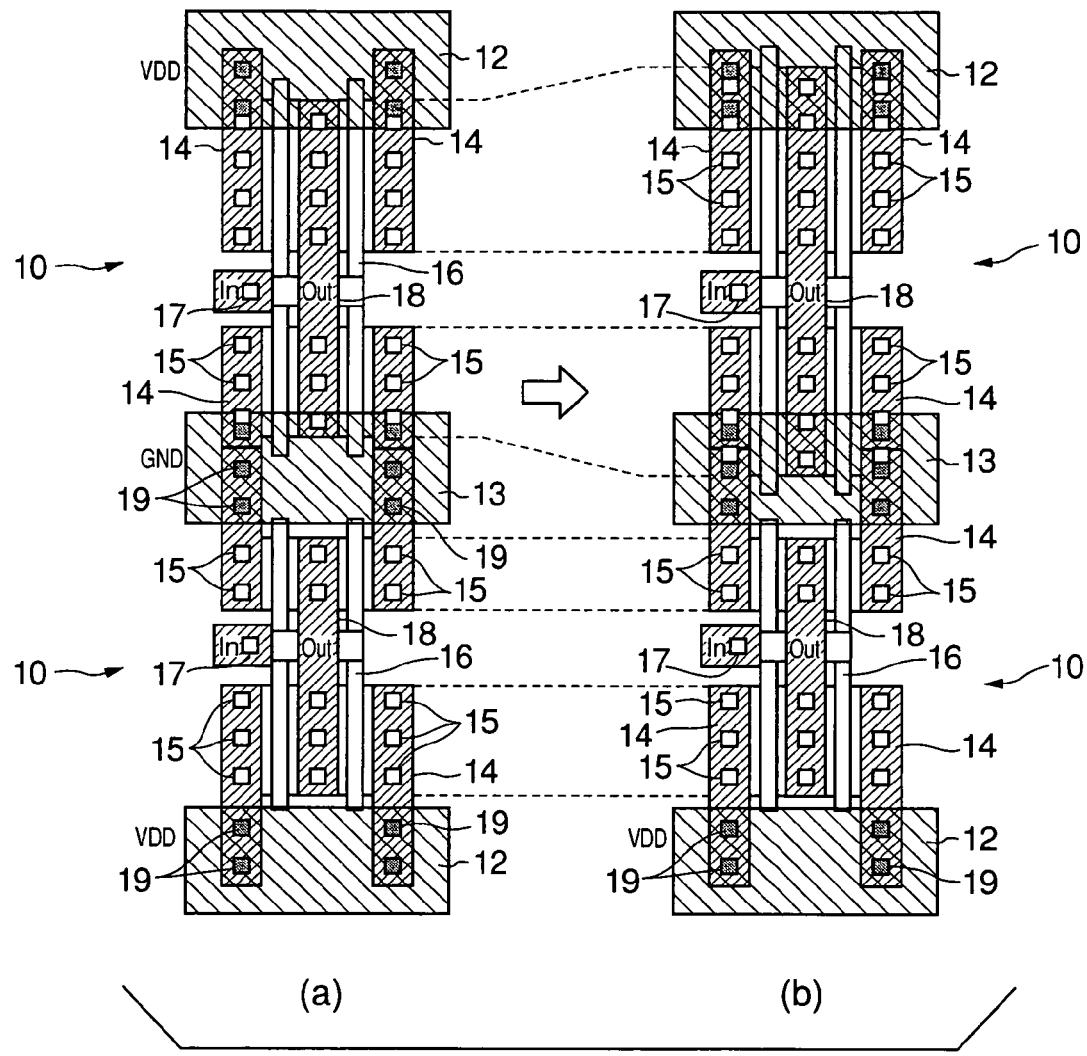
FIG. 3(a) is a plan view showing a basic cell according to a second embodiment.
FIG. 3(b) is a plan view showing resized and vertically stacked upper-layer metal power standard cells.

FIGS. 3(a) (b) show plan views of upper-layer metal power standard cells according to a second embodiment. In the drawings, an example for resizing a transistor is shown in a case where rows of standard cells are flipped and stacked/arranged in multiple stages. Here, multiple-stage stacking indicates that standard cells 10 are continuously connected in the other direction (longitudinal direction in the drawing) crossing one direction (transverse direction in the drawing) in which basic power metal layers 12, 13 are extended at right angles. In the drawing, reference numerals identical to or corresponding to those of constituting elements in a first embodiment of FIGS. 1, 2 are used. In FIGS. 3(a) (b), the basic power supply metal layers 12 are in upper and lower parts of the drawing, one basic power ground metal layer 13 is disposed in a middle, and one power metal layer on a ground side can be saved.

FIG. 3(a) shows a constitution corresponding to FIG. 1(a). A plurality of standard cells 10 stacked in multiple stages are continuously disposed in the other direction. In two vertically stacked standard cells 10 and 10 shown in FIG. 3(a), the basic power metal layers 12, 13 are formed in the second layer, and a transistor element layer by the inner wire layer 14 and polycrystalline silicon layer 16 is formed as a first layer between a semiconductor substrate and the second layer.

FIG. 3(a) shows an example in which sizes of cells are enlarged by optimization in a cell upper stage, the size of the lower cell is small, and there is an allowance with respect to the basic power metal layer. In this case, the basic power metal layers 12, 13 are formed in an upper layer by resizing as shown in FIG. 3(b), and a size adjustment width of the transistor broadens as compared with a conventional case in which the basic power metal layers 12, 13 are formed in the first layer. Therefore, the transistor of the upper cell is larger and can be disposed in a lower side as compared with a case where the basic power metal layers 12, 13 are disposed in the first layer.

In the upper-layer metal power standard cell according to the above-described first embodiment, an example of the embodiment in which a plurality of standard cells are disposed has been described. According to the upper-layer metal power standard cell of the second embodiment, the basic power metal layer comprises the power supply metal layer 12 and the ground power metal layer 13. In a plurality of standard cells, the power supply metal layer 12 and the ground power metal layer 13 continued in one direction (transverse direction in the drawing) in the standard cell are arranged on the same line. Two standard cells adjacent to the other direction (longitudinal direction in the drawing) crossing one direction at right angles may be disposed in such a manner as to share either of the power supply metal layer 12 and the ground power metal layer 13. In the constitution of FIGS. 3(a) (b), the ground power metal layer 13 is shared between vertically stacked adjacent standard cells. This actual constitution will be described later with reference to FIGS. 5(a) (b).

As described above, in the whole constitution of the second embodiment common to FIGS. 3(a) (b), the transistor element layer and the inner wire layer formed in the first layer which is an underlayer are disposed with respect to a plurality of standard cells. Moreover, in the upper-layer metal power standard cell in which the second layer is disposed as the upper-layer basic power metal layer for a plurality of standard cells, the upper-layer basic power metal layer comprises a power supply metal layer and a ground power metal layer. As to the plurality of standard cells, the power supply metal layers and the ground power metal layers in the standard cells continuing in one direction of the second layer are continuously arranged on the same line. Two adjacent standard cells in the other direction crossing one direction at right angles are standard cells arranged in such a manner as to share either the power supply metal layer and the ground power metal layer.

Moreover, in the upper-layer metal power standard cell shown in FIG. 3(a), the first layer is extended in the other direction of the underlayer of the metal layer centering on the ground power metal layer which is one of the upper-layer basic power metal layers extended in one direction in the above-described whole constitution. An end portion on the opposite side of an end portion positioned under the ground power metal layer of the first layer is formed in the underlayer of two power supply metal layers extending in parallel as the upper-layer basic power metal layer which is the second layer.

Furthermore, in the upper-layer metal power standard cell shown in FIG. 3(b), in the above-described constitution, two standard cells comprise the power supply metal layers distant toward the outside from the ground power metal layer extended in the center of the other direction, and extended in one direction. An input terminal for supplying a signal to the inner wire and an output terminal for outputting the signal from the inner wire are disposed substantially in the middle of the other direction. Positions in which the ground power metal layers and the power supply metal layers are formed in two standard cells continuously disposed in one direction, and positions in which the input and output terminals in the two standard cells are aligned and arranged on one straight line.

Third Embodiment

Figure 4:
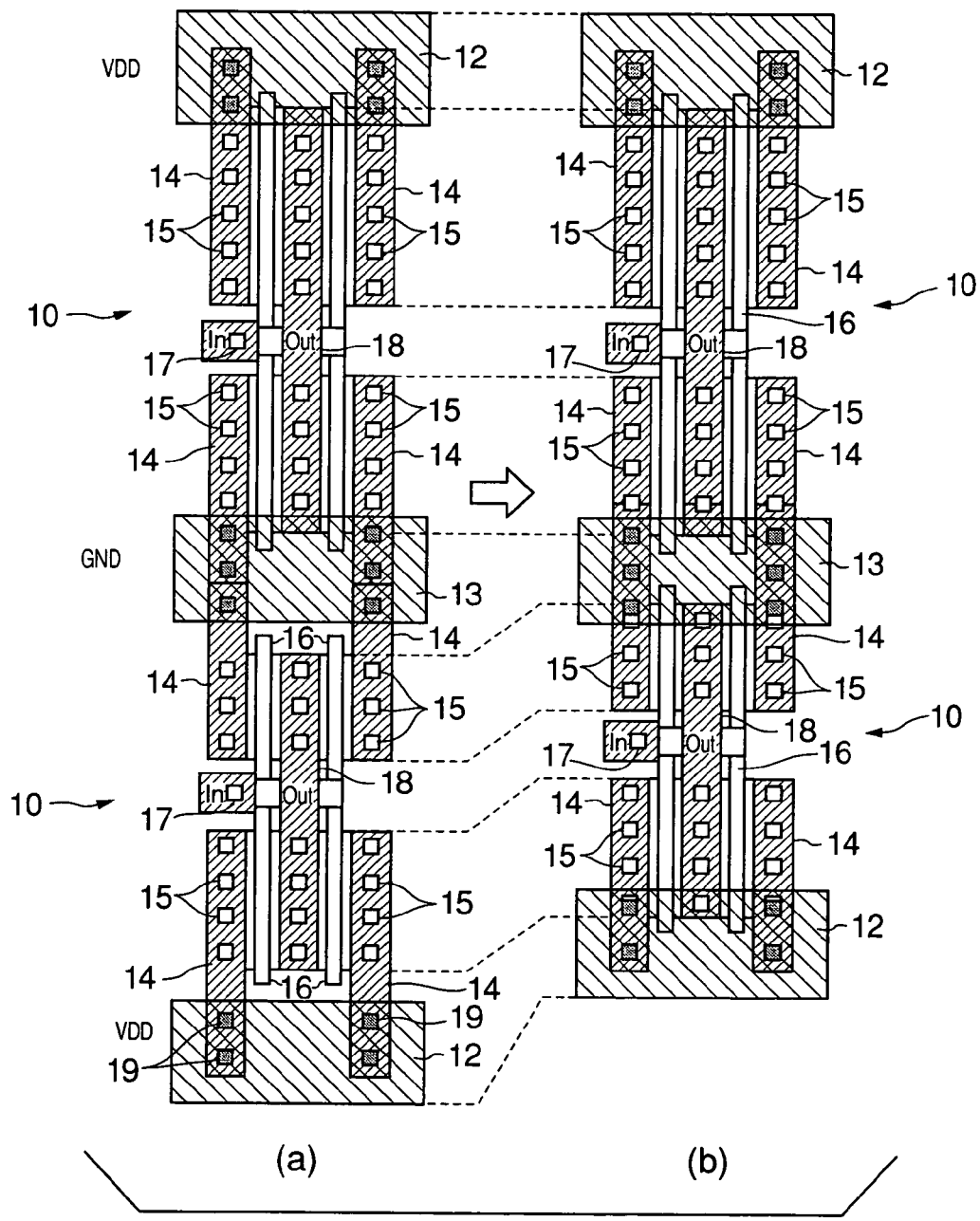
FIG. 4(a) is a plan view showing a basic cell according to a third embodiment.
FIG. 4(b) is a plan view showing compacted vertically stacked upper-layer metal power standard cells.

An upper-layer metal power standard cell according to a third embodiment shows an example of compaction in a case where cells are stacked in multiple stages as shown in FIGS. 4(a)(b). In FIGS. 4(a)(b), constituting elements denoted with the same reference numerals as those used in FIGS. 1(a) to 3(b) show the same constituting elements as those of the upper-layer metal power standard cell according to first and second embodiments.

In FIG. 4(a), the constitution itself includes the constitution of the upper-layer metal power standard cell shown in FIGS. 1(a) and 2(a). The upper cell cannot be reduced further in the other direction (longitudinal direction in the drawing), but the lower cell can be reduced. In this case, as shown in FIG. 4(b), the only lower side of a basic power metal layer 13 for a ground power, disposed in a center, is compacted. Accordingly, a portion in which a basic power metal layer 12 positioned on the lower side is disposed is moved as shown by a broken line. Inner wire layers 14 and polycrystalline silicon layers 16 may be compressed between the lower basic power metal layer 12 and the central basic power metal layer 13.

As described above, in the whole constitution of the third embodiment common to FIGS. 4(a) (b), the transistor element layer and the inner wire layer formed in the first layer which is the underlayer are disposed with respect to a plurality of standard cells. In the upper-layer metal power standard cell disposed in the second layer which is the upper-layer basic power metal layer for a plurality of standard cells, a plurality of standard cells are arranged in the other direction. Even when densities of the transistor element layers and inner wire layers in the second layer in two adjacent standard cells are different from each other, the interval between the power supply metal layer and the ground metal layer is set to be constant, and a plurality of upper-layer metal power standard cells having an equal size are arranged. This circuit arrangement is disposed/mixed with a circuit arrangement in which a compactable upper-layer metal power standard cell is compacted, and sizes of two upper-layer metal power standard cells adjacent in the other direction are set to be different from each other.

Moreover, in the upper-layer metal power standard cell shown in FIG. 4(a), in the above-described constitution, in a circuit arrangement in which densities of the transistor element and inner wire layer of the first layer disposed in the other direction are different from each other, a densest circuit arrangement is used as a basis, the interval of the basic power metal layer which is the second layer determined by disposing the densest circuit arrangement in the first layer is set, and the power metal layer of the second layer is set and formed.

Furthermore, in the upper-layer metal power standard cell shown in FIG. 4(b), in the above-described constitution, the first layers of the plurality of cells disposed in the other direction have the transistor elements and inner wires arranged at different densities. In this case, the circuit arrangement densely arranged using the densest circuit arrangement as a basis is disposed in the first layer to thereby determine the interval of the basic power metal layers, and accordingly the power metal layer of the second layer is set in a first size. The first size is mixed/disposed with a second size in each of the plurality of standard cells. In the second size, the circuit arrangement obtained by compacting a compactable dense circuit arrangement by a predetermined amount is disposed in the first layer to thereby determine/set the interval of the basic power metal layers, and the power metal layer of the second layer is set.

Fourth Embodiment

Figure 5:
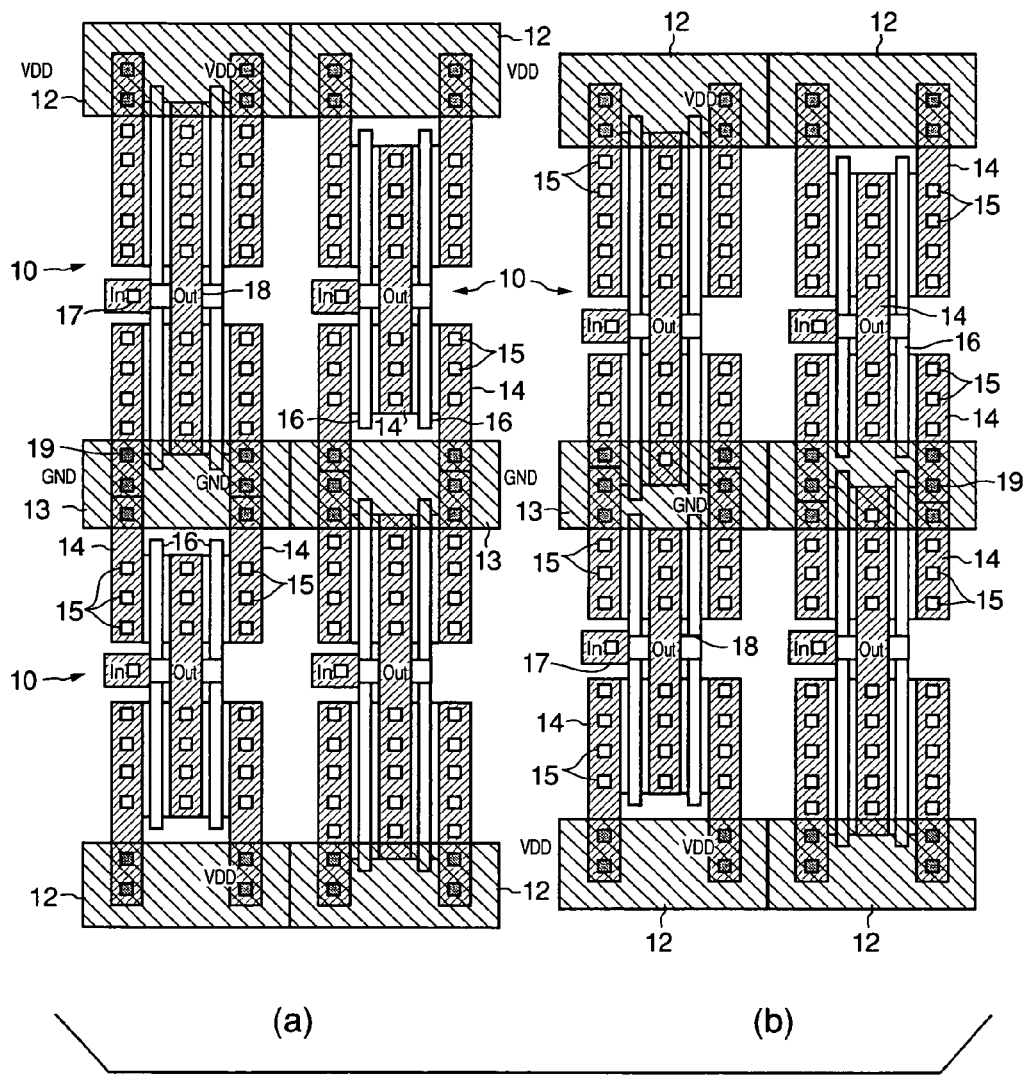
FIG. 5(a) is a plan view showing a basic cell according to a fourth embodiment.
FIG. 5(b) is a plan view showing compacted vertically/horizontally connected upper-layer metal power standard cells.

An upper-layer metal power standard cell according to a fourth embodiment shown in FIG. 5 relates to a constitution in which cells are arranged not only in one direction (longitudinal direction in the drawing) as in the third embodiment but also in the other direction (transverse direction in the drawing). FIGS. 5(a)(b) show a case where two cells are arranged in the both directions, that is, four cells are longitudinally/transversely arranged. In this case, as shown in FIG. 5(a), in all three cells, inner wire layers 14 and polycrystalline silicon layers 16 formed in a first layer are disposed under basic power metal layers 12, 13 formed in a second layer so that all of four circuits can be resized.

Furthermore, when the height of the row is compacted to thereby control the speed on right lower and left upper sides in FIG. 5(a), there are right upper and left lower spaces as shown in FIG. 5(a). Therefore, a height direction is reduced as a whole. As shown in FIG. 5(b), positions of upper and lower basic power metal layers 12 for supplying power can be shortened and moved in middle directions. In a conventional power line in a case where a basic power metal layer is disposed in the first layer, reducible ratio by compaction drops from restrictions of right lower and left upper cell heights. On the other hand, in the fourth embodiment, a ratio at which a circuit constitution can be reduced by compaction can be raised.

A substantial number of standard cells are arranged in longitudinal and transverse directions, compaction is performed in the longitudinal direction in the same method, the resizing is similarly performed, and the size of the other direction (longitudinal direction) crossing one direction in which basic power metal is extended at right angles can be freely set.

As described above, in the whole constitution of the upper-layer metal power standard cell according to the fourth embodiment shown in FIGS. 5(a)(b), in the basic constitution of the present embodiment, a plurality of standard cells are arranged in one direction and the other direction. Moreover, even when densities of the transistor element layers and inner wire layers in the other direction of the second layer in the standard cells arranged in one direction and the other direction, intervals of the power supply metal layers and the ground metal layers in one direction and the other direction are set to be constant. A plurality of cells all comprise the upper-layer metal power standard cells having an equal size.

Moreover, in the constitution, the upper-layer metal power standard cell of FIG. 5(a) comprises: a second layer disposed in one direction while the intervals of the power supply metal layers and the power ground metal layers in the other direction are set to be constant; and a first layer comprising a transistor element layer and an inner wire layer disposed as the underlayer of the second layer in the other direction under the power metal and ground metal layers.

Furthermore, in the upper-layer metal power standard cell of FIG. 5(b), in the constitution, a plurality of standard cells having densities of circuit arrangements of the first layers are arranged in the other direction and one direction. Moreover, there is a circuit arrangement capable of being compacted and resized with respect to the first layer of each of the plurality of cells. A plurality of upper-layer metal power standard cells each having an equal size are compacted and resized by circuit arrangements in the first layers of the plurality of cells determined by an equal size which is a maximum size that can be minimized with respect to each cell, and the basic power metal layer of the second layer disposed at an interval in accordance with the circuit arrangement of the first layer.

The above-described first to fourth embodiments relate to the upper-layer metal power standard cell, but the present embodiment is not limited to the standard cell which is a "device", and the present embodiment can be realized even by a method of manufacturing the standard cell having the above-described constitution. A method of manufacturing the upper-layer metal power standard cell according to fifth to seventh embodiments will be described hereinafter.

Fifth Embodiment

Figure 6:
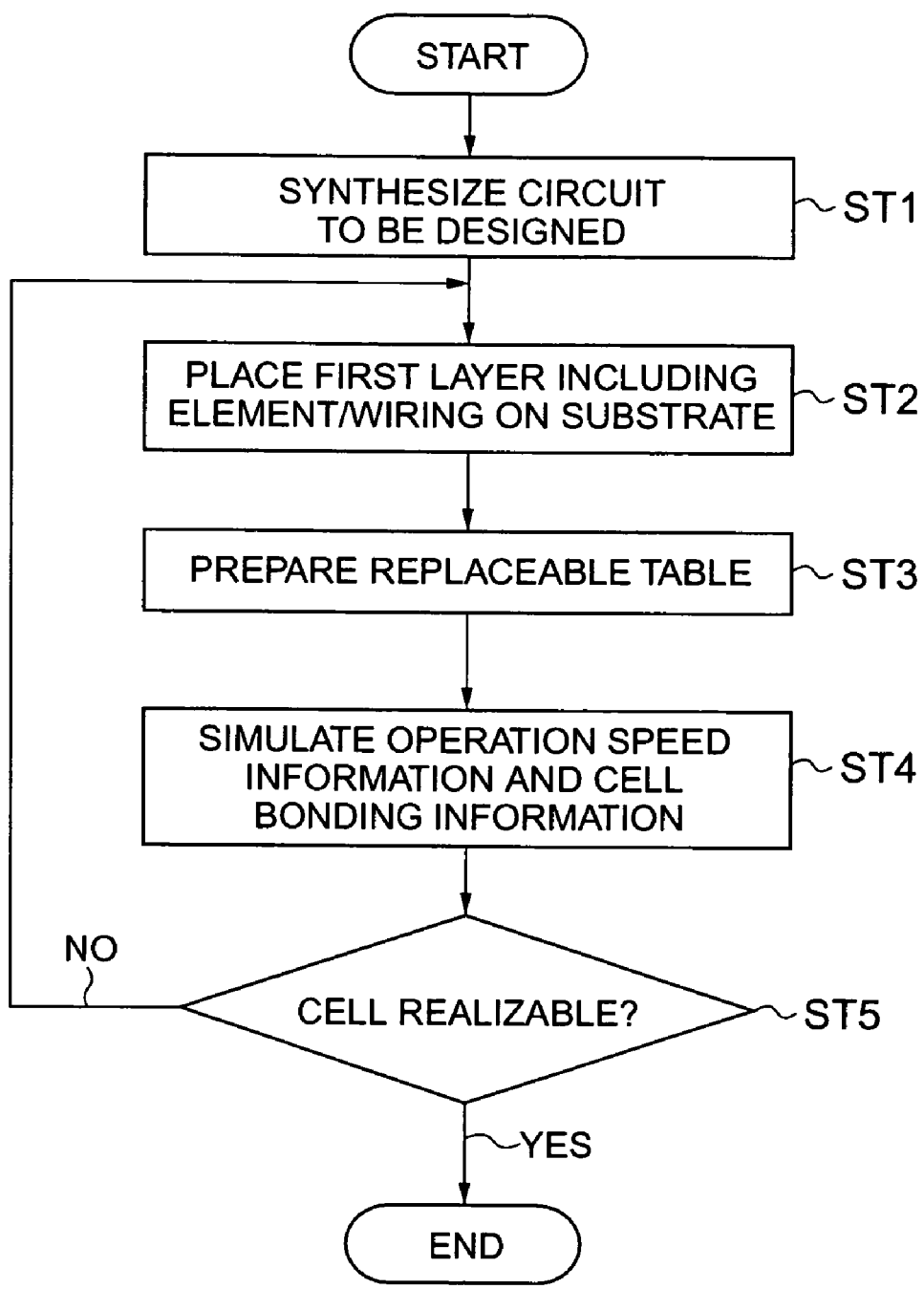
FIG. 6 is a flowchart showing manufacturing steps of a method of manufacturing an upper-layer metal power standard cell according to a fifth embodiment.

FIG. 6 is a flowchart showing a process operation of a method of manufacturing an upper-layer metal power standard cell according to a fifth embodiment. In FIG. 6, a circuit to be designed as a standard cell is synthesized in a first step ST1, a first layer including a transistor element and a wire layer constituting a circuit is disposed on a semiconductor substrate based on the circuit synthesized in a second step ST2, and a replaceable table is prepared with respect to placing information of the first layer based on height information and transistor length information of the standard cell in a third step ST3. Next, in a fourth step ST4, in an allowable range of the replaceable table, a second layer which is a power metal layer is disposed in a predetermined position on the first layer, and operation speed information and cell bonding information in the transistor element and signal wire layer are simulated. It is judged in step ST5 whether or not a desired standard cell can be realized by design information, second to fourth steps ST2 to ST4 are repeatedly judged until the cell can be realized, and accordingly the standard cell is formed.

A plurality of standard cells formed through the steps ST1 to ST5 are arranged in one direction (transverse direction in FIG. 5), and a plurality of cells are also arranged in the other direction (longitudinal direction in FIG. 5) crossing one direction at right angles. After disposing the first layers over both the one direction and the other direction crossing each other at right angles, the power metal layer of the second layer is disposed. That is, according to a method of manufacturing the standard cell of the fifth embodiment, when the cell is used as the standard cell, a driving voltage supplied from the basic power metal layer is important. However, priority is given to the circuit which is a driving object, and the circuit is designed in a designing process. Simulation is performed in accordance with the synthesized circuit arrangement several times, and basic power metal layers are disposed at optimum intervals in positions.

Sixth Embodiment

Figure 7:
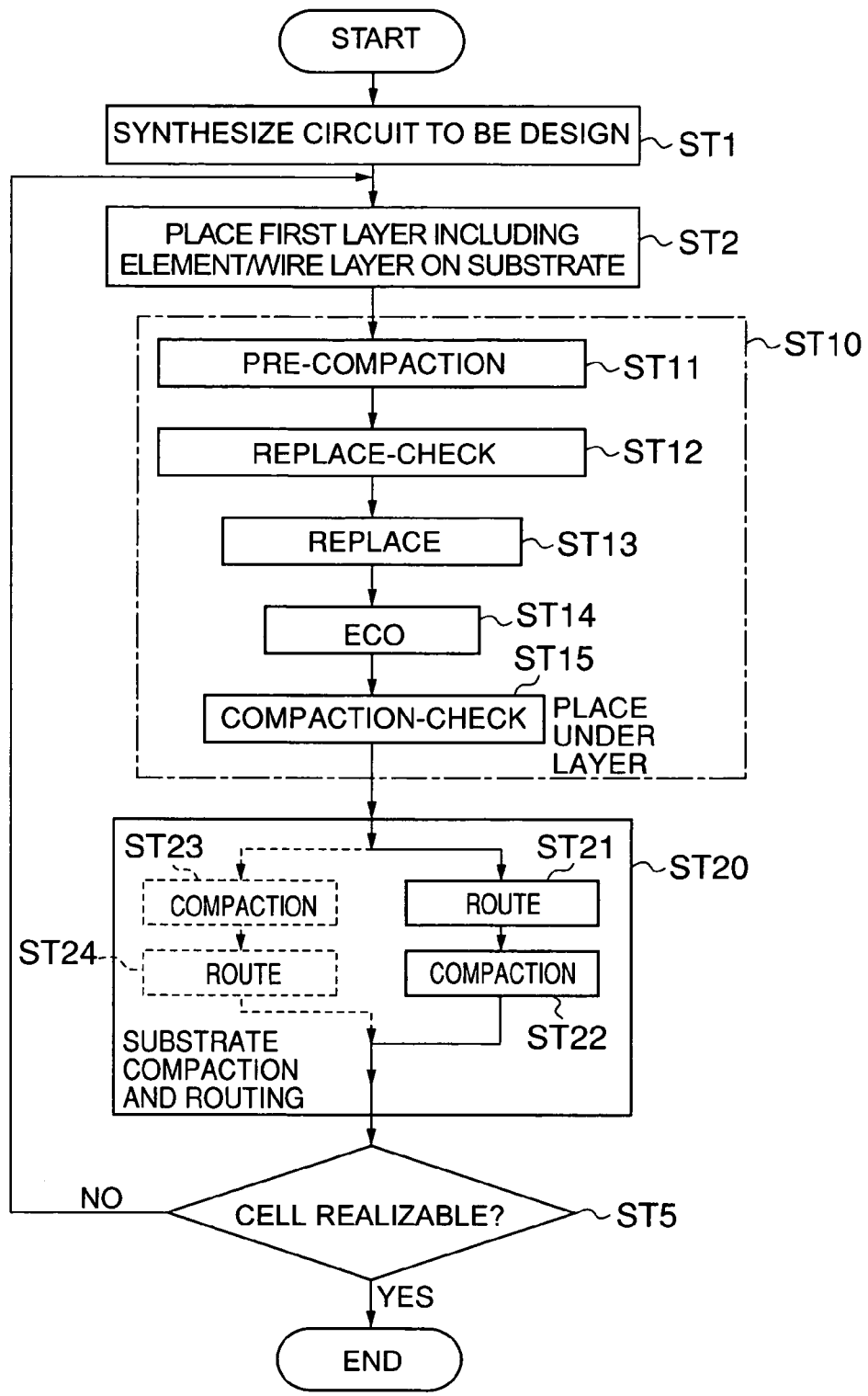
FIG. 7 is a flowchart showing manufacturing steps of the method of manufacturing the upper-layer metal power standard cell according to a sixth embodiment.

Next, a method of manufacturing an upper-layer metal power standard cell according to a sixth embodiment will be described using a flowchart shown in FIG. 7. In the sixth embodiment, the fifth embodiment shown in FIG. 6 will be described in more detail. In FIG. 7, steps denoted with the same reference numerals as those of FIG. 6 indicate steps identical or corresponding to those of a process operation of the fifth embodiment.

As shown in FIG. 7, a circuit to be designed is synthesized in order to realize a function of a circuit to be used in step ST1, and a first layer including an element/wire layer is placed on a semiconductor substrate in step ST2. The following five steps are generally included in step ST10 of disposing the underlayer (first layer). This step ST10 includes: a pre-compaction step ST11 of compacting an element in advance; a replace-check step ST12 of checking replacement of element arrangement; a step ST13 of actually performing replacement in a case where there is not any problem in a result of replacement check; an engineering change order (ECO) step ST14 of recovering an only change portion in a short time without influencing any layout portion in a case where a portion of a logical circuit is changed; and a compaction-check step ST15 of checking compaction of the transistor element. In the step ST14, delay may be analyzed and a buffer may be inserted at a time when layout design ends in order to improve performance of LSI, fan-out may be divided to thereby optimize the delay or the area, and the same step may be performed continuously with a process operation of the step ST13.

When it is confirmed that the circuit operates without any problem even by performing compaction by the placing step ST10 of the underlayer, including the steps ST11 to ST15, actual compaction and placing of the substrate are performed in step ST20. In step ST20, as shown by solid lines, after first performing routing in step ST21, the compaction may be performed in step ST22. As shown by broken lines, after performing the compaction in step ST23, the routing may be performed in step ST24. Here, the compaction refers to a tool or a process for compressing a redundant portion of a layout pattern while satisfying a predetermined design rule in order to reduce the size of a chip or cell in the layout design. The process also includes a function of expanding an insufficient element or wire interval following the design rule. In the routing step of the step ST21 (ST24), an automatic placement and routing algorithm may be used.

Finally, in the same manner as in the fifth embodiment, it is judged in step ST5 whether or not the cell can be realized by the designed circuit placement and routing. When it is judged that the cell can be realized, a process flow ends. In a case where the cell cannot be realized, the circuit of the underlayer including the first layer is placed again, and the circuit placement and routing of the underlayer is simulated until the cell can be realized. Finally, an optimum circuit arrangement and routing are determined, and the basic power metal layer is also disposed in the upper layer to complete the standard cell.

Seventh Embodiment

Figure 8:
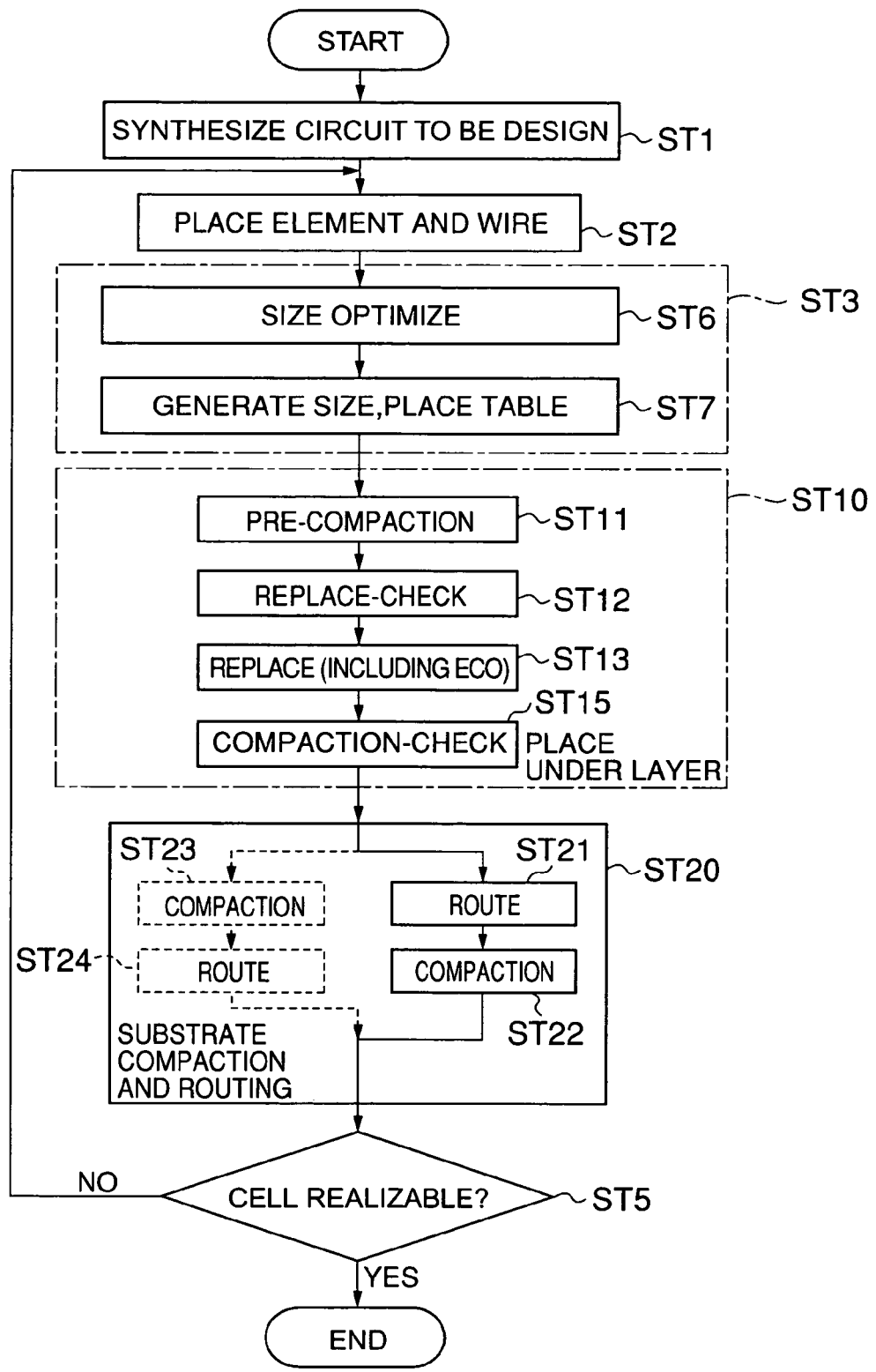
FIG. 8 is a flowchart showing manufacturing steps of the method of manufacturing the upper-layer metal power standard cell according to a seventh embodiment.

Next, a method of manufacturing an upper-layer metal power standard cell according to a seventh embodiment will be described using a flowchart shown in FIG. 8. The seventh embodiment also shows the fifth embodiment shown in FIG. 6 in more detail in the same manner as in the sixth embodiment. In FIG. 8, the step ST3 of preparing the replacement table in the method of manufacturing the upper-layer metal power standard cell according to the fifth embodiment shown in FIG. 6 is constituted in more detail. The step ST10 of placing the underlayer, and the compacting/routing step ST20 have substantially the same constitutions as those of the manufacturing method of the sixth embodiment shown in FIG. 7.

In FIG. 8, after placing the element and wire in the step ST2, a circuit size is optimized in step ST6. Next, in step ST7, placing information is formed into a table considering circuit size information to thereby generate a size•place table. The steps ST6 and ST7 form the replacement table generation step ST3.

In the same manner as in the sixth embodiment of FIG. 7, a step ST10 which is a flow for placing an underlayer comprises: a step ST11 of performing pre-compaction; a replace-check step ST12 of checking the replaced arrangement; a step ST13 of replacing the arrangement of the underlayer, including an ECO step ST14 in FIG. 7; and a compaction-check step ST15 of checking a compacted situation of the circuit. As described above, since the ECO step ST14 is performed simultaneously in the replacing step ST13, the number of steps decreases by one, but there is not any change in contents.

In the same manner as in FIG. 7, a flow for compacting and routing of the underlayer in step ST20 comprises a routing step ST21, and a compaction step ST22. However, the flow may comprise a compaction step ST23 and a routing step ST24 as shown by a broken line on the left side of a block. Thereafter, in the same manner as in the manufacturing method according to the fifth and sixth embodiments, it is judged in step ST5 whether or not the cell can be realized by compaction and routing. When it is judged in the step ST5 that the cell can be realized, a manufacturing flow ends. When it is judged in the step ST5 that the cell cannot be realized, a flow from the step ST2 is repeated to thereby simulate an optimum standard cell in which a transistor element layer and inner wire layer are formed in the underlayer, and a basic power metal layer is formed in the upper layer.

According to the above-described method of manufacturing the upper-layer metal power standard cell according to the fifth to seventh embodiments, the standard cell in which the element layer and the wire layer are formed in the underlayer, and the basic power metal layer is formed in the upper layer of the second layer can be manufactured in any method.

Eighth Embodiment

A constitution of an upper-layer metal power standard cell according to the above-described first to fourth embodiments, and the manufacturing method according to the fifth to seventh embodiments will be generally described hereinafter. It is also possible to realize an upper-layer metal power standard cell according to an eighth embodiment having the following manufacturing process. In the upper-layer metal power standard cell according to the eighth embodiment, a circuit to be designed as a standard cell is synthesized, a transistor element and a signal wire layer constituting a circuit based on the synthesized circuit are arranged in the underlayer of a semiconductor substrate, and a replaceable table is prepared with respect to placing information of the underlayer based on height information of the standard cell and information of the transistor length. In an allowable range of the replaceable table, an upper-layer basic power metal layer is disposed in a predetermined position on the underlayer, and operation speed information and cell bonding information in the transistor element and the signal wire layer are simulated to thereby manufacture the cell.

Ninth Embodiment

Figure 9:
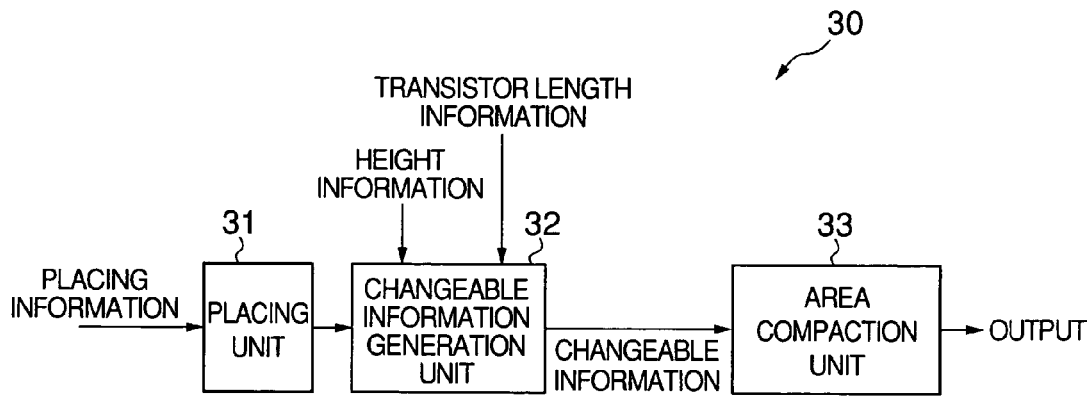
FIG. 9 is a function block diagram showing a constitution of an area compression apparatus according to a ninth embodiment.

It is to be noted that the present invention is not limited to an upper-layer metal standard cell and a method of manufacturing the cell according to the first to eighth embodiments, and the present invention can be performed also by an area compression apparatus using the above-described manufacturing method. As shown in FIG. 9, an area compression apparatus 30 according to a ninth embodiment includes: a placing unit 31 for placing the standard cell based on predetermined placing information concerning a circuit synthesized using the standard cell; a changeable information generation unit 32 for preparing changeable information including changeable allowable amounts of a height of the standard cell and a transistor length with respect to placing information of the standard cells obtained by the placing unit 31 based on height information of the arranged standard cells and the standard cell in the vicinity, and transistor length information described in each disposed standard cell and the standard cell in the vicinity; and an area compression unit 33 for changing the height of the standard cell to thereby compress a circuit area in a range of the allowable amount included in the changeable information.

Tenth Embodiment

Figure 10:
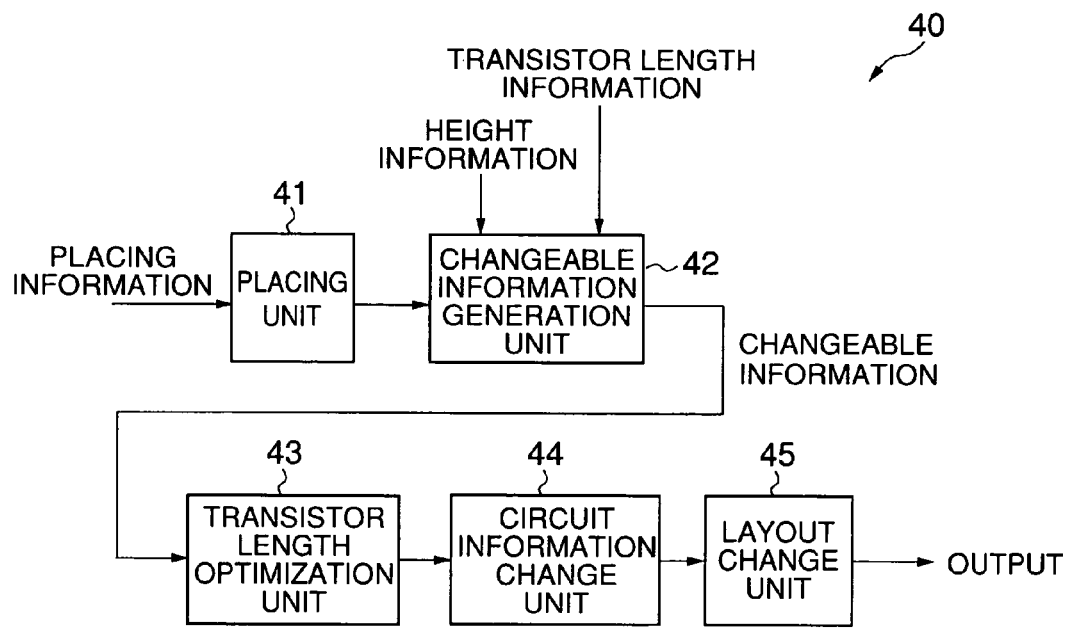
FIG. 10 is a function block diagram showing a constitution of a circuit optimization apparatus according to a tenth embodiment.

Furthermore, the present invention is not limited to the above-described first to ninth embodiments, and can be realized also by a circuit optimization apparatus including a constitution of each of the above-described embodiments. As shown in FIG. 10, a circuit optimization apparatus 40 according to a tenth embodiment comprises: a placing unit 41 for placing the standard cell based on predetermined placing information concerning a circuit synthesized using a standard cell; a changeable information generation unit 42 for preparing changeable information including changeable allowable amounts of a height of the standard cell and a transistor length with respect to the placing information of the standard cells obtained from the placing unit 41 based on height information of arranged standard cells and the standard cell in the vicinity, and transistor length information described in each disposed standard cell and the standard cell in the vicinity; a transistor length optimization unit 43 for changing the transistor length in the range of the allowable amount included in the changeable information, calculating the transistor length in such a manner that at least one of circuit operation speed, power consumption, and area is optimum, and generating optimum transistor length information; a circuit information changing unit 44 for changing circuit information of the transistor length in the standard cell disposed by the placing unit 41 in accordance with the optimum transistor length information output from the transistor length optimization unit 43; and a layout change unit 45 for changing layout of the transistor length inside the standard cell disposed by the placing unit 41 in accordance with the optimum transistor length information output by the transistor length optimization unit 43.

As described above, according to the embodiments, when the upper-layer basic power metal layer is disposed on the underlayer including the transistor element or the inner wire, the length (height) of the cell between the basic power metal layers can be reduced. Restrictions on size boundaries among a plurality of standard cells can be realized, and it is possible to provide a standard cell having a satisfactory area efficiency as a whole. Furthermore, size readjustment (resizing) of the transistor in the standard cell, or compaction (compaction of arrangement) can be efficiently performed.

What is claimed is:

1. A standard cell which is used for providing a desired logical function with a semiconductor integrated circuit chip, the standard cell being placement information of a layout pattern in which an optimum arrangement of a basic logical circuit is designed within a predetermined area by an arrangement of transistor elements and an arrangement of inner metal wires, and has a power layer disposed at an upper-layer in the inner metal wires, and in which an upper-layer metal power standard cell comprises a basic power metal layer which is disposed in an upper layer of a circuit and which supplies a power voltage from an outside of the upper-layer metal power standard cell; a transistor element layer which is formed in a predetermined arrangement on a circuit substrate under the basic power metal layer; and an inner wire layer which supplies the power voltage to the transistor element layer disposed under the basic power metal layer disposed in the upper layer from the basic power metal layer, wherein the basic power metal layer, the transistor element layer and the inner wire layer constitute the standard cell, wherein the transistor element layer and the inner wire layer form an underlayer in which the transistor element layer and the inner wire layer are formed as an optimized standard cell being placement information of a layout pattern which is designed by repeating several times a predetermined processing of a compaction or resizing, and wherein the underlayer includes a plurality of compacted or resized transistor elements are formed on the circuit substrate.

2. The upper-layer metal power standard cell according to claim 1, further comprising:

the underlayer in which the compacted transistor element layer and inner wire layer are formed on the circuit substrate; and an upper-layer basic power metal layer disposed in an upper layer of the and connected to the inner wire layer, wherein the transistor element layer and the inner wire layer formed in a first layer which is the underlayer are arranged in each standard cell, and a second layer is disposed as the upper-layer basic power metal layer for a plurality of standard cells.

3. The upper-layer metal power standard cell according to claim 1, further comprising:

the underlayer in which the resized transistor element layer and inner wire layer are formed on the circuit substrate; and an upper-layer basic power metal layer disposed in an upper layer of the underlayer and connected to the inner wire layer, wherein the transistor element layer and the inner wire layer formed in a first layer which is the underlayer are arranged in each standard cell, and a second layer is disposed as the upper-layer basic power metal layer for a plurality of standard cells.

4. The upper-layer metal power standard cell according to claim 1,
wherein the upper-layer basic power metal layer comprises: a basic power supply metal layer; and a basic power ground metal layer extended in the same direction and disposed facing each other, the inner wire or a polycrystalline silicon layer for forming a transistor element are disposed in the underlayer formed under basic power supply and ground metal layers of upper layers on the semiconductor substrate, an end portion side of the underlayer, and the upper-layer basic power metal layer have a range superimposed in a depth direction of the cell, and the upper-layer basic power metal layer is electrically connected to the inner wire layer constituting the underlayer.

5. The upper-layer metal power standard cell according to claim 4,
wherein the underlayer including the polycrystalline silicon layer and the inner wire are formed in a first layer counted from the substrate, the upper-layer basic power metal layer is formed in a second layer counted from the substrate, the first layer is electrically connected to the second layer, and a power is supplied to the inner wire and the transistor element from the upper-layer basic power metal layer.

6. The upper-layer metal power standard cell according to claim 4,
wherein the underlayer including the polycrystalline silicon layer and the inner wire layer is formed in a first layer counted from the substrate, the upper-layer basic power metal layer is formed in a second layer counted from the substrate, contacts are formed at predetermined intervals in the inner wire layer of the first layer, a portion of the inner wire layer in which any contact is not formed is compacted, the first layer is compacted in the other direction crossing the one direction at right angles to thereby compact the first layer, and the upper-layer basic power metal layer of the second layer is formed facing the compacted first layer in the one direction.

7. The upper-layer metal power standard cell according to claim 4,
wherein the underlayer including the polycrystalline silicon layer and the inner wire layer is formed in a first layer counted from the substrate, the upper-layer basic power metal layer is formed in a second counted layer counted from the substrate, contacts are formed at predetermined intervals in the inner wire layer of the first layer, the contact is formed in a portion of the inner wire layer in which any contact is not formed to thereby change a size of the first layer, accordingly the first layer is resized, and the upper-layer basic power metal layer of the second layer is disposed facing the resized first layer, and formed in one direction.

8. The upper-layer metal power standard cell according to claim 7,
wherein the first layer is extended in the other direction of the underlayer of the metal layer centering on the ground power metal layer which is one of the upper-layer basic power metal layers extended in one direction, and other end portions of the first layer positioned under the ground power metal layer are formed in underlayers of two parallel power supply metal layers which are other upper-layer basic power metal layers of the second layer.

9. The upper-layer metal power standard cell according to claim 8,
wherein an input terminal for supplying a signal to the inner wire and an output terminal for outputting the signal from the inner wire are disposed substantially in middles of other directions in two standard cells comprising power supply metal layers which are disposed at predetermined distances outside the ground power metal layer extended in a center of the other direction and which are extended in one direction, and positions in which the ground power metal layers and the power supply metal layers are formed in two standard cells disposed continuously in one direction, and positions in which the input and output terminals in the two standard cells are formed are aligned and disposed on one straight line.

10. The upper-layer metal power standard cell according to claim 6, further comprising in a mixed manner: a circuit arrangement in which a plurality of standard cells are arranged in the other direction and in which intervals of the power supply metal layers and the ground metal layers are set to be constant, even when densities of the transistor element layers and the inner wire layers of the second layers in two adjacent standard cells are different from each other and in which a plurality of upper-layer metal power standard cells having an equal size are arranged; and a circuit arrangement in which compactable upper-layer metal power standard cells are compacted to thereby set sizes of two upper-layer metal power standard cells disposed adjacent in the other direction in a case where the densities are different.

11. The upper-layer metal power standard cell according to claim 10,
wherein an interval of basic power metal layers which are the second layers determined by disposing a densest circuit arrangement in the first layer is set using the densest circuit arrangement as a reference to thereby set and form a power metal layer of the second layer in a circuit arrangement in which the densities of the transistor element and the inner wire of the first layer disposed in the other direction are different.

12. The upper-layer metal power standard cell according to claim 11, further comprising: a plurality of standard cells having, in a mixed manner, a first size in which the interval of the basic power metal layer determined by disposing a densest circuit arrangement in the first layer is set using the densest circuit arrangement as a reference to thereby set a power metal layer of the second layer, and a second size in which an interval of the basic power metal layer determined by disposing the circuit arrangement compacted by a predetermined amount in the first layer is set with respect to a circuit arrangement having a compactable density in the first layer to thereby set a power metal layer of the second layer in a case where the first layers of a plurality of cells arranged in the other direction have transistor elements and inner wires arranged with different densities.

13. The upper-layer metal power standard cell according to claim 1,
wherein a plurality of standard cells are arranged in the one direction and the other direction, intervals of the power supply metal layer and the ground metal layer in the one direction and the other direction are set to be constant even when densities of the transistor element layer and the inner wire layer of the second layer are different in the other direction in the standard cells arranged in the one direction and the other direction, and a plurality of cells all comprise upper-layer metal power standard cells having an equal size.

14. The upper-layer metal power standard cell according to claim 13, further comprising: a second layer in which an interval of the power supply metal layer and the power ground metal layer is set to be constant in the other direction and which is disposed in the one direction; and a first layer constituting the underlayer of the second layer, and comprising a transistor element layer and an inner wire layer disposed in the other direction under the power supply and ground metal layers.

15. The upper-layer metal power standard cell according to claim 13, further comprising: a plurality of standard cells having an equal size compacted and resized by a circuit arrangement in the first layers of a plurality of cells determined by an equal size which is a maxim size of each cell capable of being reduced at the maximum, a basic power metal layer of a second layer disposed at an interval in accordance with the circuit arrangement of the first layers, in a circuit arrangement in which a plurality of standard cells having different densities of the circuit arrangement of the first layer are arranged in the other direction and the one direction and in which the first layer of each of the plurality of cells is capable of being compacted and resized.

16. A standard cell which is used for providing a desired logical function with a semiconductor integrated circuit chip, the standard cell being placement information of a layout pattern in which an optimum arrangement of a basic logical circuit is designed by an arrangement of transistor elements and an arrangement of inner metal wires within a predetermined area, and the standard cell has a basic power layer at an upper-layer in the inner metal wires, wherein the semiconductor integrated circuit chip comprises a plurality of upper-layer power metal standard cells which constitute a plurality of parts of the semiconductor integrated circuit, wherein each of the plurality of the upper-layers comprises a semiconductor substrate as a circuit substrate of the standard cell, an underlayer formed on the semiconductor substrate, and an upper-layer power metal layer formed on the underlayer and supplying a power voltage from an outside of the standard cell, wherein the underlayer comprises a transistor element layer and an inner wire layer, in which a plurality of transistor elements and inner wires is arranged according to circuit layout information synthesized to be designed as a certain standard cell, and an entire size of the certain standard cell and other standard cell is optimized by compacting both the standard cells in a manner of conforming the circuit layout information of the certain standard cell to a circuit layout information of the other standard cell which constitutes the semiconductor integrated circuit chip, and wherein the upper-layer power metal layer has a size designed to coincide with a size of the underlayer which is designed to an optimized size by compacting a respective standard cell.

17. The standard cell having a basic power metal layer at the upper-layer according to claim 16, wherein each of the plurality of upper-layer metal power standard cells comprises:

a schematic wiring information in which a schematic wiring pattern is designed after wiring in accordance with a desired relationship, an optimized transistor element layout information obtained after transistor elements are compacted by using the schematic wiring information, and a detailed wiring information in which a detailed wiring pattern is designed to the optimized transistor element layout information.

18. A standard cell which is used for providing a desired logical function with a semiconductor integrated circuit chip, the standard cell being placement information of a layout pattern in which an optimum arrangement of a basic logical circuit is designed by an arrangement of transistor elements and an arrangement of inner metal wires within a predetermined area, and the standard cell has a basic power layer at an upper-layer in the inner metal wires, wherein the semiconductor integrated circuit chip comprises a plurality of upper-layer power metal standard cells which constitute a plurality of parts of the semiconductor integrated circuit, wherein each of the plurality of the upper-layers comprises a semiconductor substrate as a circuit substrate of the standard cell, an underlayer formed on the semiconductor substrate, and an upper-layer power metal layer formed on the underlayer and supplying a power voltage from an outside of the standard cell, wherein the underlayer comprises a transistor element layer and an inner wire layer, in which a plurality of transistor elements and inner wires are arranged according to circuit layout information synthesized to be designed as a certain standard cell, and an entire size of the certain standard cell and other standard cell is optimized by resizing both the standard cells in a manner of conforming the circuit layout information of the certain standard cell to a circuit layout information of the other standard cell which constitutes the semiconductor integrated circuit chip, and the upper-layer power metal layer has a size designed to coincide with a size of the underlayer which is designed to an optimized size by resizing in a respective standard cell.

19. The standard cell having a basic power metal layer at the upper-layer according to claim 18, wherein each of the plurality of upper-layer metal power standard cell comprises:

a detailed wiring information in which a detailed wiring pattern is designed to the plurality of standard cells arranged in accordance with a desired relationship, and an optimized transistor element layout information obtained after transistor elements are resized by using the detailed wiring information.

* * * * *